(12) United States Patent
Huang et al.

(10) Patent No.: US 12,740,397 B2
(45) Date of Patent: Sep. 15, 2026

(54) SEMICONDUCTOR PATTERN AND METHOD OF ROUNDING THE SAME

(71) Applicant: UNITED MICROELECTRONICS CORP., Hsin-Chu City (TW)

(72) Inventors: Bo-Wei Huang, Tainan City (TW); Po-Hung Chen, Taitung County (TW); Chun-Cheng Yu, Pingtung County (TW); I-Hsien Liu, Tainan City (TW); Ho-Yu Lai, New Taipei City (TW); Kuan-Wen Fang, Tainan City (TW); Chih-Sheng Chang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 678 days.

(21) Appl. No.: 18/118,093

(22) Filed: Mar. 6, 2023

(65) Prior Publication Data

US 2024/0266286 A1 Aug. 8, 2024

(30) Foreign Application Priority Data

Feb. 3, 2023 (CN) ........................ 202310091405.X

(51) Int. Cl.
*H10W 20/43* (2026.01)
*H10W 20/00* (2026.01)

(52) U.S. Cl.
CPC ......... *H10W 20/43* (2026.01); *H10W 20/067* (2026.01)

(58) Field of Classification Search
CPC ........... H01L 23/528; H01L 2224/0235; H01L 2224/02375; H10W 20/43
See application file for complete search history.

(56) References Cited

U.S. PATENT DOCUMENTS

| | | | | |
|---|---|---|---|---|
| 8,368,224 | B2 * | 2/2013 | Aboush | B81B 7/007 257/773 |
| 8,624,392 | B2 * | 1/2014 | Yew | H01L 24/13 257/737 |
| 10,199,318 | B2 * | 2/2019 | Liu | H01L 23/3128 |
| 11,545,451 | B2 * | 1/2023 | Kim | H01L 24/05 |
| 11,728,308 | B2 * | 8/2023 | Lo | H01L 23/49811 257/737 |

* cited by examiner

*Primary Examiner* — Daniel Luke
(74) *Attorney, Agent, or Firm* — Winston Hsu

(57) ABSTRACT

A semiconductor pattern is provided in the present invention, including a first line extending to one end in a first direction and a second line extending in a second direction perpendicular to the first direction and adjacent to the end of the first line in the first direction, wherein the end of the first line is provided with a rounding feature, the first line has a width in the second direction, and the width is gradually increased to a maximum width toward the end and gradually converged to form the rounding feature.

8 Claims, 1 Drawing Sheet

SEMICONDUCTOR PATTERN AND METHOD OF ROUNDING THE SAME

BACKGROUND OF THE INVENTION

1. Field of the Invention

The present invention relates generally to a semiconductor pattern, and more specifically, to a semiconductor pattern with rounding feature and method of rounding the same.

2. Description of the Prior Art

Embedded high voltage (eHV) technology uses CMOS-based logic process to manufacture high-voltage driver ICs required by various monitors, which plays an important part in the manufacture of display panel like LCD, OLED, or emerging micro-LED and micro-OLED, etc. In comparison to ordinary logic device, eHV device requires higher driving voltage (between 5V and 27V), whose tolerance voltage applied in time-dependent dielectric breakdown (TDDB) test may reach up to ten times of the one of ordinary logic device. In addition, pointed features in semiconductor pattern usually have larger charge density since their smaller radius of curvature, so that the electric field induced at these pointed features is quite high, which may reach up to one hundred times of the one in ordinary logic device. This extremely high electric field tends to burn-out the dielectrics near the pointed features, which impacts the reliability of device.

SUMMARY OF THE INVENTION

In the light of aforementioned issues encountered in technology of current embedded high-voltage (eHV) device, the present invention hereby provides a novel semiconductor pattern and method of rounding the same, with feature of forming a rounding feature at the pointed end of semiconductor pattern with a width larger than the original width of line pattern, so as to lower the electric field at the end to avoid the issues of dielectrics burn-out and device reliability.

One aspect of present invention is to provide a semiconductor pattern, including a first line extending to one end in a first direction, and a second line extending in a second direction perpendicular to the first direction and adjacent to the end of the first line, wherein the end of the first line is provided with a rounding feature, the first line has a width in the second direction, and the width gradually increases to a maximum width toward the end and then gradually decreases and converges to form the rounding feature at the end.

Another aspect of the present invention is to provide a method of rounding semiconductor pattern, including steps of providing a semiconductor pattern having a first line and a second line, wherein the first line extends in a first direction to one end, and the second line extends in a second direction perpendicular to the first direction and adjacent to the end of the first line in the first direction, and using optical proximity correction (OPC) tool to perform a rounding action to the end of the first line so as to form a rounding feature at the end, wherein the first line has a width in the second direction, and the width gradually increases to a maximum width toward the end and then gradually decreases and converges to form the rounding feature at the end.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
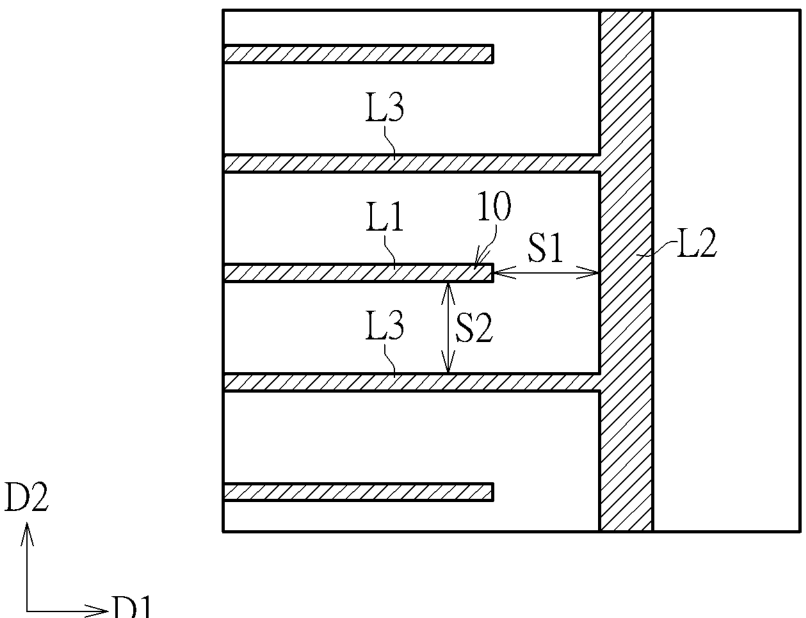
FIG. 1 is a layout of a semiconductor pattern in accordance with the embodiment of present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Please refer to FIG. 1, which is a layout of a semiconductor pattern in accordance with the embodiment of present invention. The semiconductor pattern of present invention generally includes a first line L1 extending in a first direction D1 to one end 10 and a second line L2 extending in a second direction D2 perpendicular to the first direction D1. The second line L2 is adjacent to the end 10 of first line L1 in the first direction D1, and the two lines are separated by a first spacing S1 in the first direction D1.

The semiconductor pattern of present invention may further include third lines L3 at two sides of the first line L1 in the second direction D2. The third line L3 extends in the first direction D1 to connect with the second line L2. In the embodiment of present invention, multiple third lines L3 and multiple first lines L1 may be parallel to each other and alternately arranged in the second direction D2, and the third line L3 and the first line L1 are separated by a second spacing S2 in the second direction D2.

In actual implementation, the first line L1, second line L2 and third line L3 may be conductive metal lines with dielectrics isolated therebetween. In conventional skill, since the operating voltage of embedded high voltage (eHV) device is higher (5V-27V in comparison to 1.2V-3.3V of ordinary logic device) and the pointed feature at the end 10 of first line L1, the electric field there will be higher (may reach up to one hundred time of ordinary logic device) and tends to burn-out the surrounding dielectrics, especially along the discharge path between the end 10 of first line L1, the second line L2 and the third line L3. The burn-out of dielectrics may cause issues in the aspect of electrical property, reliability and life time of the device.

Figure 2:
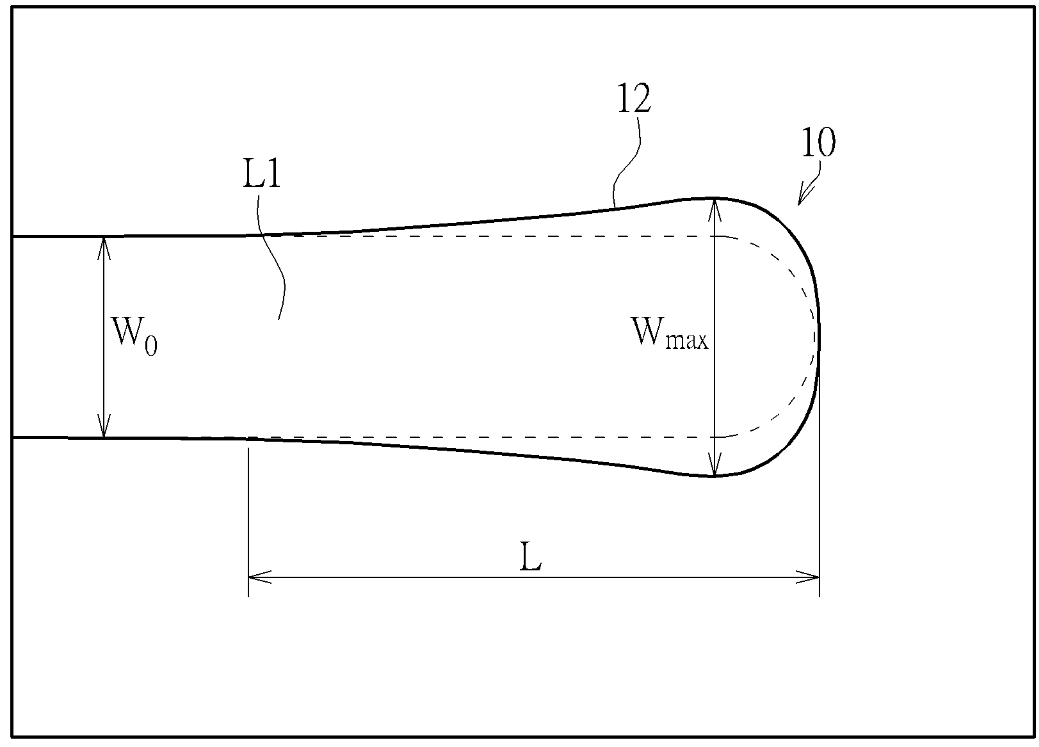
FIG. 2 is an enlarged schematic view of a semiconductor pattern in accordance with the embodiment of present invention.

Please refer to FIG. 2, which is an enlarged schematic view of a semiconductor pattern in accordance with the embodiment of present invention. In order to solve the aforementioned issues, the present invention uses optical proximity correction (OPC) tool to perform a rounding action to the end 10 of first line L1, so as to form a rounding feature 12 at the end. Specifically, as shown in figure, the first line L1 has an initial width $W_0$ gradually increasing to a maximum width $W_{max}$ toward the end 10 and then gradually decreasing and converging to form the rounding feature 12 at the end 10.

Please note that the width of rounding feature 12 formed in the rounding action of present invention is larger than the initial width $W_0$ of first line L1 before the convergence, so that its radius of curvature (i.e. half of the maximum width $W_{max}$) is increased and the electric field there is therefore decreased. In comparison to the feature of present invention above, common line-end rounding action in prior art is directly decreasing and converging the line width toward the end to form a rounding feature (as denoted by the dashed line in the figure), with its width not excessing the predetermined line width $W_0$, so that the radius of curvature of the rounding feature is not relatively increased with respect to the original line width, which has limited effect to decrease the electrical field.

Furthermore, please refer back to FIG. 1. Since the first line L1, second line L2 and specific design of the first line L1 in the semiconductor pattern of present invention, in the embodiment of present invention in addition of forming the rounding feature above, the issue of discharge burn-out may be further prevented by specifying the dimension of these features. For example, the first spacing S1 may be designedly between 200 nm and 300 nm, the ratio of first spacing S1 to the maximum width $W_{max}$ of rounding feature 10 may be designedly between 1.5 and 3.0, the initial width $W_0$ of first line L1 may be designedly between 80 nm and 100 nm, the ratio of the maximum width $W_{max}$ of rounding feature 10 to the initial width $W_0$ of first line L1 may be designedly between 0.5 and 1.2, the radius of curvature of the rounding feature 10 (half of the maximum width $W_{max}$) may be designedly between 30 nm and 50 nm, or the ratio of the first spacing S1 to the second spacing S2 may be designedly between 1.0 and 2.0. Besides, as shown in FIG. 2, a ratio of a length L from a position of the width of first line L1 beginning to increase to the end to the maximum width $W_{max}$ of the rounding feature 10 may be designedly between 1.0 and 2.0.

According to the embodiment above, the semiconductor pattern and method of rounding the same provided by the present invention may decrease the electric field at line end through the formation of the rounding feature with width larger than the original line width, thereby preventing the device reliability issue caused by the burn-out of adjacent dielectrics and being particularly suitable for the manufacture of eHV devices, which is invention provided both with novelty and non-obviousness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor pattern, comprising:

a first line extending to one end in a first direction; and a second line extending in a second direction perpendicular to said first direction and adjacent to said end of said first line, wherein said second line does not overlap said first line in a vertical direction, said vertical direction being perpendicular to said first direction and said second direction, and a first spacing is defined between said end and said second line in said first direction;

wherein said end of said first line is provided with a rounding feature, said first line has a width in said second direction, and said width gradually increases to a maximum width toward said end and then gradually decreases and converges to form said rounding feature at said end.

2. The semiconductor pattern of claim 1, wherein said first spacing is between 200 nm and 300 nm.

3. The semiconductor pattern of claim 1, wherein a ratio of said first spacing to said maximum width of said rounding feature in said second direction is between 1.5 and 3.0.

4. The semiconductor pattern of claim 1, wherein said width of said first line is between 80 nm and 100 nm.

5. The semiconductor pattern of claim 1, wherein a ratio of said maximum width of said rounding feature in said second direction to said width of said first line in said second direction is between 0.5 and 1.2.

6. The semiconductor pattern of claim 1, wherein a half of said maximum width is a radius of curvature of said rounding feature, and said radius of curvature is between 30 nm and 50 nm.

7. The semiconductor pattern of claim 1, further comprising two third lines respectively at two sides of said first line in said second direction and extending in said first direction to connect with said second line, wherein said first spacing is between said end and said second line, a second spacing is between said first line and each of said third lines, and a ratio of said first spacing to said second spacing is between 1.0 and 2.0.

8. The semiconductor pattern of claim 1, wherein a ratio of a length from a position of said width of said first line beginning to increase to said end to said maximum width of said rounding feature is between 1.0 and 2.0.

* * * * *